United States Patent
Ishino

(10) Patent No.: US 12,057,775 B2
(45) Date of Patent: Aug. 6, 2024

(54) CURRENT DETECTION CIRCUIT, SYNCHRONOUS RECTIFICATION TYPE DC/DC BUCK CONVERTER AND CONTROL CIRCUIT THEREOF

(71) Applicant: ROHM CO., LTD., Kyoto (JP)

(72) Inventor: Tsutomu Ishino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 316 days.

(21) Appl. No.: 17/696,422

(22) Filed: Mar. 16, 2022

(65) Prior Publication Data

US 2022/0302841 A1    Sep. 22, 2022

(30) Foreign Application Priority Data

Mar. 18, 2021  (JP) .................. 2021-045005

(51) Int. Cl.
*H02M 3/158* (2006.01)
*G01R 15/16* (2006.01)
*H02M 1/00* (2006.01)
*H02P 27/08* (2006.01)

(52) U.S. Cl.
CPC .......... *H02M 3/1588* (2013.01); *G01R 15/16* (2013.01); *H02M 1/0009* (2021.05); *H02P 27/08* (2013.01)

(58) Field of Classification Search
CPC .. H02M 3/1588; H02M 1/0009; G01R 15/16; H02P 27/08
See application file for complete search history.

(56) References Cited

U.S. PATENT DOCUMENTS

| | | | | |
|---|---|---|---|---|
| 8,836,305 | B2 * | 9/2014 | Sasao | G05F 1/46 323/282 |
| 10,063,146 | B1 * | 8/2018 | Lee | G01R 19/003 |
| 2015/0145495 | A1 * | 5/2015 | Tournatory | H02M 3/156 323/282 |
| 2015/0214827 | A1 * | 7/2015 | Yoon | H02M 1/14 323/286 |
| 2020/0036289 | A1 * | 1/2020 | Nagashima | H02M 1/088 |
| 2022/0302842 | A1 * | 9/2022 | Ishino | H02M 1/08 |

FOREIGN PATENT DOCUMENTS

JP    2012039823 A    2/2012

* cited by examiner

*Primary Examiner* — Kyle J Moody
(74) *Attorney, Agent, or Firm* — CANTOR COLBURN LLP

(57) ABSTRACT

The present disclosure provides a current detecting circuit, a synchronous rectification type DC/DC buck converter and a control circuit thereof. The current detection circuit is used with a push-pull switching circuit to detect a source current flowing in a low-side transistor. The switching circuit, (i) in a first phase, connects a first end of the capacitor to a ground line, and connects a second end of the capacitor to a switch line connecting a high-side transistor and the low-side transistor. The switching circuit, (ii) in a second phase, sets the first end of the capacitor to a high impedance, and connects a second end of the capacitor to the ground line. An output circuit has a high impedance input and outputs a current detection signal based on a voltage generated at the first end of the capacitor in the second phase.

20 Claims, 8 Drawing Sheets

CURRENT DETECTION CIRCUIT, SYNCHRONOUS RECTIFICATION TYPE DC/DC BUCK CONVERTER AND CONTROL CIRCUIT THEREOF

CROSS REFERENCES TO RELATED APPLICATIONS

The present invention claims priority under 35 U.S.C. § 119 to Japanese Application, 2021-045005, filed on Mar. 18, 2021, the entire contents of which being incorporated herein by reference.

TECHNICAL FIELD

The disclosure relates current detection of a low-side transistor.

BACKGROUND

In a synchronous rectification type DC/DC buck converter, an inverter circuit for motor driving and various electronic power conversion devices, a push-pull switching circuit including a high-side transistor and a low-side transistor is used.

To control the switching circuit and its load, it is necessary to monitor a current flowing through the switching circuit. In known current detection methods, there are methods of inserting a sensing resistor in a current path to detect the voltage drop of the sensing resistor, and a method of detecting the voltage drop based on the on-resistance of a high-side transistor or a low-side transistor.

PRIOR ART DOCUMENT

Patent Publication

[Patent document 1] Japan Patent Publication No. 2012-39823

SUMMARY

Problems to be Solved by the Disclosure

When a switching circuit operates in a current source mode, detecting a current flowing through a low-side transistor is desired. In the current source mode, since the current flows in reverse with respect to the low-side transistor, a negative voltage is generated at an output node of the switching transistor. As a result, it is difficult to detect the current based on the on-resistance of the low-side transistor.

The disclosure is accomplished in view of the issue above, and an exemplary object of an aspect thereof is to provide a current detection circuit capable of detecting a current of a low-side transistor.

Technical Means for Solving the Problem

The disclosure in one aspect relates to a current detection circuit. The current detection circuit is used with a push-pull switching circuit that includes a high-side transistor and a low-side transistor, and detects a source current flowing through the low-side transistor. The current detection circuit includes: a capacitor; a switch circuit, (i) in a first phase, connecting a first end of the capacitor to a ground line, and connecting a second end of the capacitor to a switch line to which the high-side transistor and the low-side transistor are connected, and (ii) in a second phase, setting the first end of the capacitor to a high impedance, and connecting the second end of the capacitor to the ground line; and an output circuit, having a high impedance input and outputting a current detection signal based on a voltage generated at the first end of the capacitor in the second phase.

The disclosure in another aspect relates to a control circuit, which is a control circuit for a synchronous rectification type DC/DC buck converter including a high-side transistor and a low-side transistor. The control circuit includes: a current detection circuit, generating a current detection signal which indicates a current flowing through the low-side transistor while the low-side transistor is on; and a pulse modulator, generating a pulse signal for controlling the high-side transistor and the low-side transistor based on the current detection signal. The current detection circuit includes: a capacitor; a switch circuit, (i) in a first phase, connecting a first end of the capacitor to a ground line, and connecting a second end of the capacitor to a switch line to which the high-side transistor and the low-side transistor are connected, and (ii) in a second phase, setting the first end of the capacitor to a high impedance, and connecting the second end of the capacitor to the ground line; and an output circuit, having a high impedance input and outputting a current detection signal based on a voltage generated at the first end of the capacitor in the second phase.

Moreover, any combination of the elements above, and any embodiments by conversions between expressions of the elements in terms of methods, devices and systems of the disclosure may also effectively serve as embodiments of the disclosure.

Effects of the Present Disclosure

The disclosure in one aspect is capable of detecting a current of a low-side transistor.

DETAILED DESCRIPTION OF THE EMBODIMENTS

Summary of Embodiments

Figure 1:
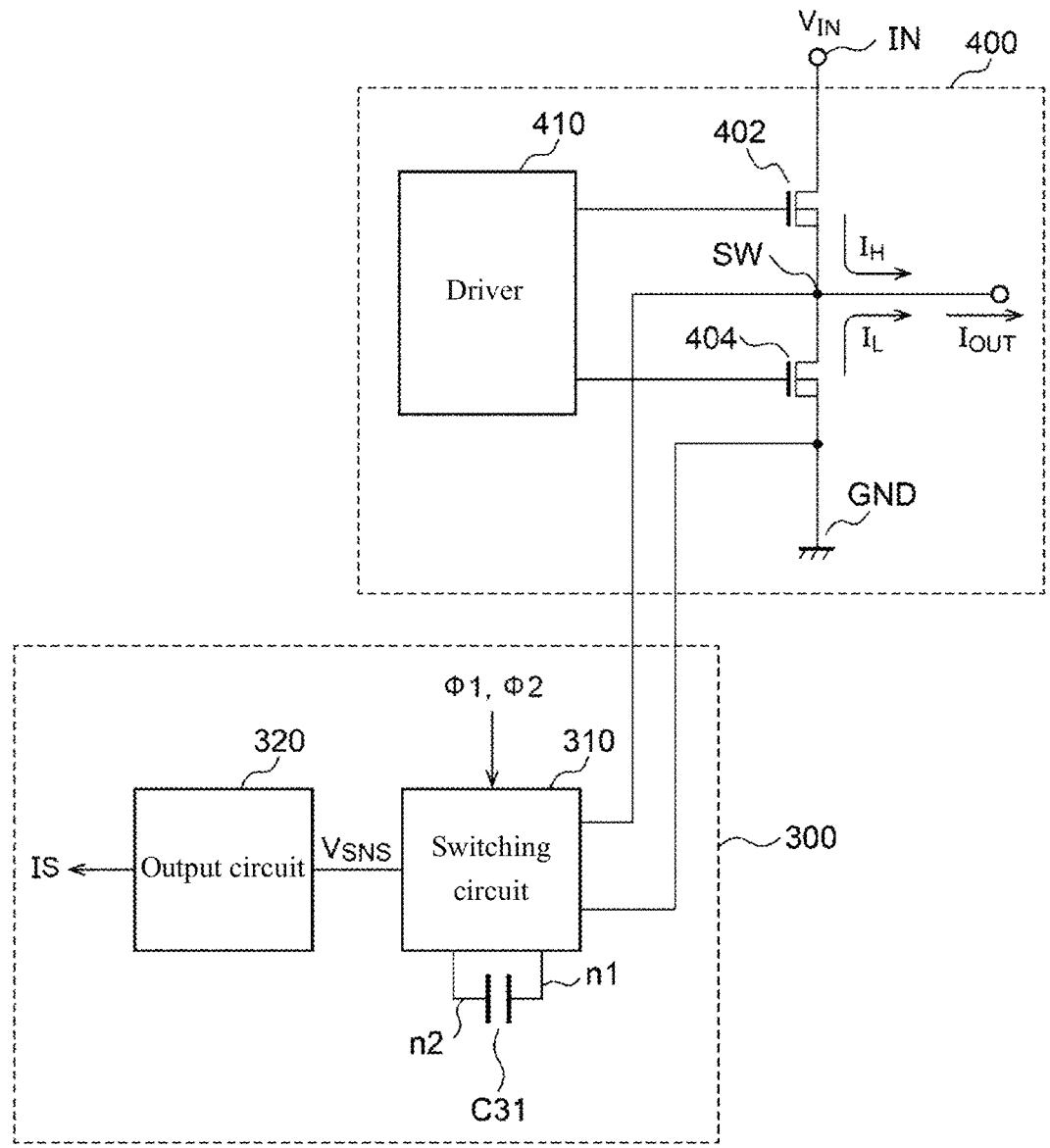
FIG. 1 is a circuit diagram of a current detection circuit according to an embodiment.

A summary of several exemplary embodiments of the disclosure is given below. The summary serves as the preamble of the detailed description to be given shortly, and aims to provide fundamental understanding of the embodiments by describing several concepts of one or more embodiments in brief. It should be noted that the summary is not to be construed as limitations to the scope of the disclosure. Moreover, the summary does not necessarily encompass all conceivable and possible embodiments, and does not provide specific definitions for essential constituent elements of the embodiments. For the sake of better description, "one embodiment" sometimes refers to one embodiment (implementation example or variation example) or multiple embodiments (implementation examples or variation examples).

According to an embodiment, a control circuit for a synchronous rectification type DC/DC buck converter including a high-side transistor and a low-side transistor includes: a current detection circuit, generating a current detection signal which indicates a current flowing through the low-side transistor while the low-side transistor is on; and a pulse modulator, generating a pulse signal for controlling the high-side transistor and the low-side transistor based on the current detection signal. The current detection circuit includes: a capacitor; a switch circuit, (i) in a first phase, connecting a first end of the capacitor to a ground line, and connecting a second end of the capacitor to a switch line to which the high-side transistor and the low-side transistor are connected, and (ii) in a second phase, setting the first end of the capacitor to a high impedance, and connecting the second end of the capacitor to the ground line; and an output circuit, having a high impedance input and outputting a current detection signal based on a voltage generated at the first end of the capacitor in the second phase.

According to the configuration, the use of a combination of the capacitor and the switching circuit can detect the voltage drop of the low-side transistor as a positive voltage, and can generate a current detection signal based on the voltage drop.

In one embodiment, the switching circuit may also include: a first switch, disposed between the first end of the capacitor and the ground line, and being turned on in the first phase; a second switch, disposed between the second end of the capacitor and the switching line, and being turned on in the first phase; a third switch, disposed between the second end of the capacitor and the ground line, and being turned on in the second phase; and a fourth switch, having an end connected to the first end of the capacitor, and being turned on in the second phase. According to the configuration, a negative voltage generated at a switch line can be converted into a positive voltage.

In one embodiment, the output circuit may also include a voltage/current conversion circuit converting the voltage generated at the first end of the capacitor into a current signal in the second phase. With the conversion to a current signal, addition or subtraction processing can be easily performed with other signals in a back-end pulse modulator.

In one embodiment, the voltage/current conversion circuit may also include: a first transistor, having a first terminal connected to a power supply line; a second transistor, having a first terminal connected to the power supply line, and including a control terminal connected to a control terminal of the first transistor; a resistor, disposed between a second terminal of the first transistor and the ground line; and an operational amplifier, receiving the voltage generated at the first end of the capacitor and a voltage at the second end of the first transistor, and having an output node connected to the control terminal of the first transistor, wherein the voltage/current conversion circuit outputs a current flowing in the second transistor.

In one embodiment, the control circuit may also be integrated in a semiconductor substrate. The so-called "integrated" includes a situation in which all constituting elements of a circuit are formed on a semiconductor substrate, and a situation in which main constituting elements of a circuit are integrated. In order to adjust circuit constants, a part of resistors or capacitors may be arranged outside the semiconductor substrate. By integrating circuits on one chip, the circuit area is reduced and characteristics of circuit elements are kept uniform.

Embodiments

Details of the embodiments are given with the accompanying drawings below. The same or equivalent constituting elements, parts and processes are represented by the same denotations, and repeated description is omitted as appropriate. It should be noted that the embodiments are non-limiting examples of the disclosure, and all features or combinations thereof described in the embodiments are not necessarily essentials of the disclosure.

In the description of the application, an expression "a state of component A connected to component B" includes, in addition to a situation where component A and component B are directly connected, a situation where component A is indirectly connected to component B via another component, and the indirect connection does not result in substantial influences on their electrical connection or does not impair functions or effects exerted by their connection.

Similarly, an expression "a state of component C arranged between component A connected to component B" includes, in addition to a situation where component A and component C, or component B and component C are directly connected, an indirect connection via another component, and the indirect connection does not result in substantial influences on their electrical connection or does not impair functions or effects exerted by their connection.

FIG. 1 shows a circuit diagram of a current detection circuit 300 according to an embodiment. The current detection circuit 300 is used with a push-pull switching circuit 400 that includes a high-side transistor 402 and a low-side transistor 404. The high-side transistor 402 is disposed between a power supply line (or an input voltage line) IN and a switch line SW, and the low-side transistor 404 is disposed between the switch line SW and a ground line GND. The high-side transistor 402 and the low-side transistor 404 are driven by a driver circuit 410. The switch line SW is connected to sensing elements such as inductors, coils and reactors.

In an operation mode in which an output current $I_{OUT}$ of the switching circuit 400 flows in a forward direction (flowing to the right in the drawing) (a current source mode), a current $I_H$ flows from the input line IN to the switch line SW while the high-side transistor 402 is on, and the voltage of the switch line SW at this point is:

$$V_{SW}=V_{IN}-R_{ON\_H}*I_H.$$

In the above, $R_{ON\_H}$ is an on-resistance of the high-side transistor 402.

Moreover, while the low-side transistor 404 is on, a current $I_L$ flows from the ground line GND to the switch line SW, and the voltage of the switch line SW at this point is:

$$V_{SW}=-R_{ON\_L}*I_L.$$

In the above, $R_{ON\_L}$ is an on-resistance of the low-side transistor 404.

The current detection circuit 300 detects the current $I_L$ flowing in the low-side transistor 404, and outputs a current detection signal IS which indicates the current $I_L$.

The current detection circuit 300 includes a capacitor C31, a switching circuit 310 and an output circuit 320.

The switching circuit 310 is connected to the capacitor C31, the switch line SW and the ground line GND, and is configured to be switched between a first phase (sampling phase) φ1 and a second phase (hold phase) φ2. The first phase #1 and the second phase φ2 are controlled by a controller that is not shown.

The switching circuit 310, (i) in the first phase φ1, connects a first end n1 of the capacitor C31 to the ground line GND, and connects a second end of the capacitor C31 to the switch line SW.

The switching circuit 310, (ii) in the second phase φ2, sets the first end n1 of the capacitor C31 to a high impedance, and connects a second end n2 of the capacitor C31 to the ground line.

The switching circuit 310 may be formed by a combination of multiple switches, and the configuration of the multiple switches is not specifically defined.

The output circuit 320 has a high-impedance input, receives a voltage $V_{SNS}$ generated at the first end n1 of the capacitor C31, and outputs the current detection signal IS based on the voltage $V_{SNS}$ at the first end n1 in the second phase φ2. The current detection signal IS generated by the output circuit 320 may also be a voltage signal, and in this case, the output circuit 320 may also be a buffer (amplifier). Moreover, the current detection signal IS may also be a current signal, and in this case, the output circuit 320 may also be a voltage/current conversion circuit.

Figure 2:
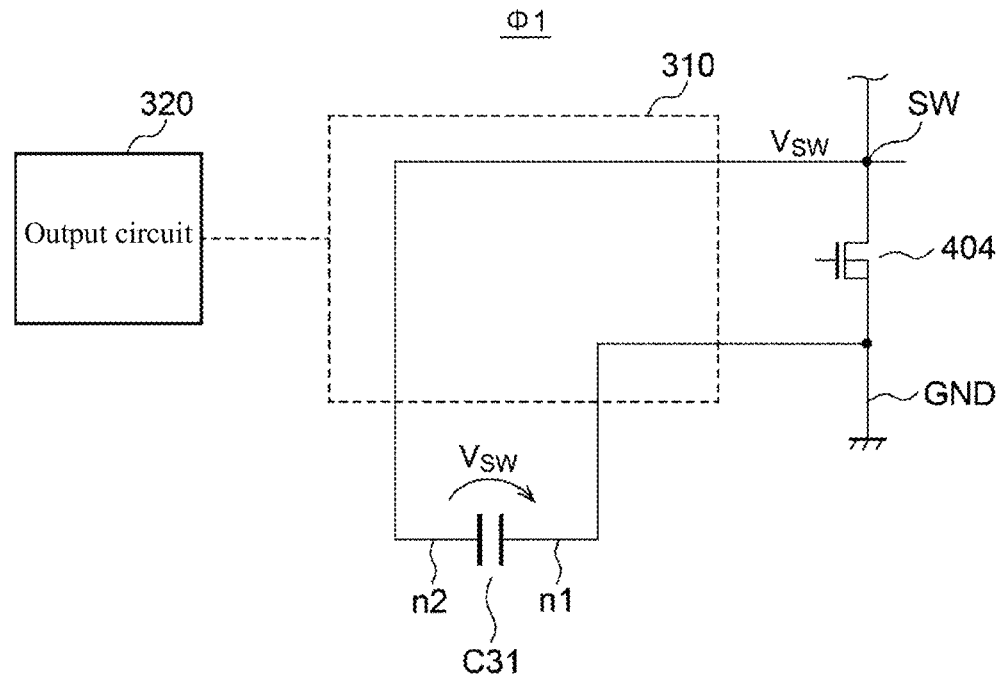
FIG. 2 is an equivalent circuit diagram of a current detection circuit in a first phase.
Figure 3:
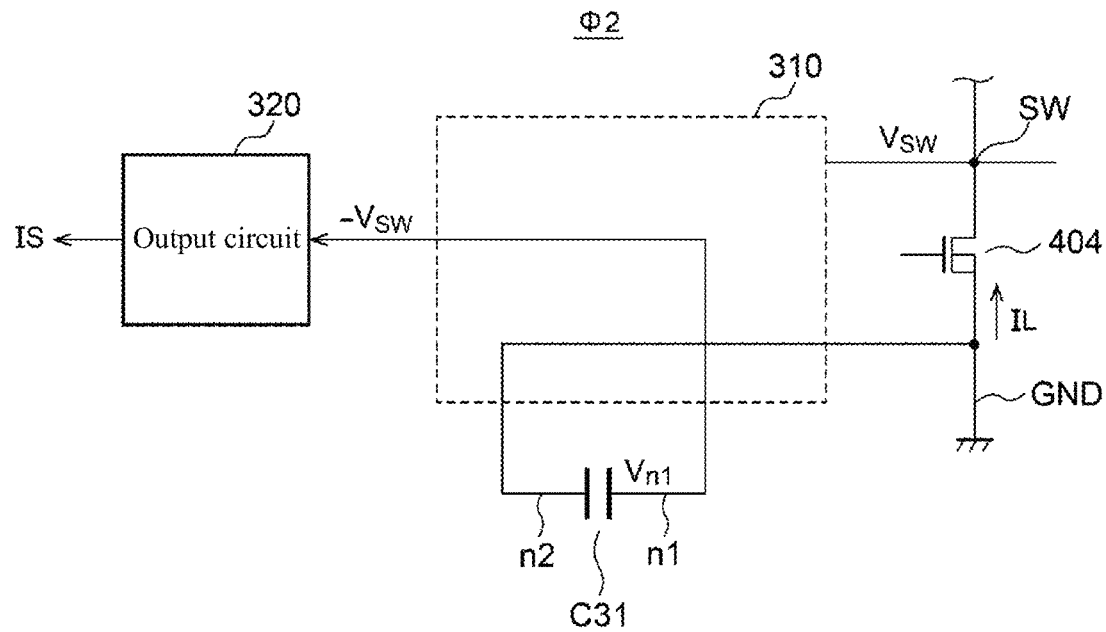
FIG. 3 is an equivalent circuit diagram of a current detection circuit in a second phase.

The configuration of the current detection circuit 300 is as described above. The operation of the current detection circuit 300 is to be described below. FIG. 2 shows an equivalent circuit diagram of the current detection circuit 300 in the first phase φ1. FIG. 3 shows an equivalent circuit diagram of the current detection circuit 300 in the second phase φ2.

Refer to FIG. 2. In the first phase φ1, the first end n1 of the capacitor C31 is grounded, and a voltage $V_{SW}$ of the switch line SW is applied to the second end n2. Accordingly, the capacitor 31 is charged by the voltage $V_{SW}$.

Refer to FIG. 3. In the following second phase φ2, the second end n2 of the capacitor C31 is grounded, a voltage $V_{n1}$ at the first end n1 is used as the detection voltage $V_{SNS}$ and output to the back-end output circuit 320. The voltage $V_{n1}$ at the first end n1 is a voltage after the polarity inversion of the switching voltage $V_{SW}$, and becomes a positive voltage. The output circuit 320 generates the current detection signal IS based on the positive detection voltage $V_{SNS}$. The output circuit 320 has a high impedance input, and thus holds the charge of the capacitor C31 during the second phase φ2 so that the voltage $V_{n1}$ is fixed.

Figure 4:
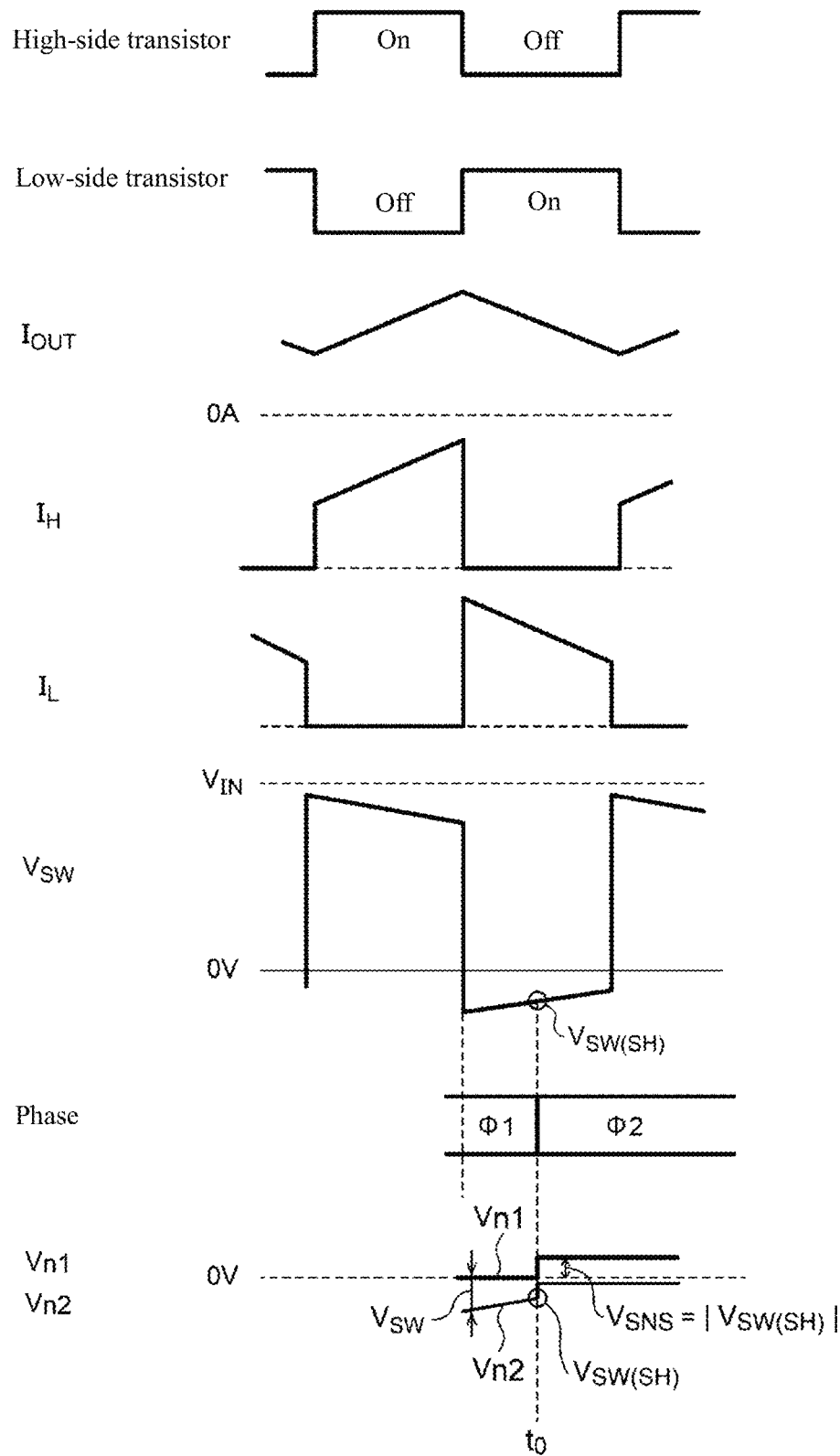
FIG. 4 is a waveform diagram of the operation of the current detection circuit in FIG. 1.

FIG. 4 shows a waveform diagram of the operation of the current detection circuit 300 in FIG. 1. The high-side transistor 402 and the low-side transistor 404 are turned on in a complementary manner. In practice, a dead time is inserted between an on period of the high-side transistor 402 and the low-side transistor 404, with however associated details omitted herein.

The description is given by focusing on the on period (low-side on period) $T_L$ of the low-side transistor 404. The voltage $V_{SW}$ of the switch line SW is a negative voltage as described above, and changes according to $V_{SW}=-R_{ON\_L}*I_L$.

In the low-side on period $T_L$, the current detection circuit 300 becomes in the first phase φ1. At this point, the voltage $V_{n1}$ at the first end n1 of the capacitor C31 becomes 0 V, and a voltage $V_{n2}$ at the second end n2 is equal to the voltage $V_{SW}$ of the switch line SW and becomes a negative voltage. A voltage between two ends of the capacitor C31 is equal to an absolute value of the switching voltage $V_{SW}$.

At a sensing timing (timing $t_0$), the phase is switched to the second phase φ2. In the second phase φ2, the two ends of the capacitor C31 become a high impedance, and so charge is stored. Thus, in the second phase φ2, the voltage between two ends thereof is kept a voltage level equal to an absolute value $V_{SW(SH)}$ of the switching voltage $V_{SW}$ at the timing $t_0$. In the second phase φ2, since the second end n2 becomes 0 V, the voltage $V_{n1}$ at the first end n1 becomes a positive voltage $|V_{SW(SH)}|$ representing the absolute value $V_{SW(SH)}$ of the switching voltage $V_{SW}$, and the voltage $V_{n1}$ is used as the detection voltage $V_{SNS}$ and output.

The operation of the current detection circuit 300 is described above. According to the current detection circuit 300, the use of a combination of the capacitor C31 and the switching circuit 310 can detect and use the voltage drop of the low-side transistor 404 as a positive voltage, and can generate the current detection signal IS based on the voltage drop.

Figure 5:
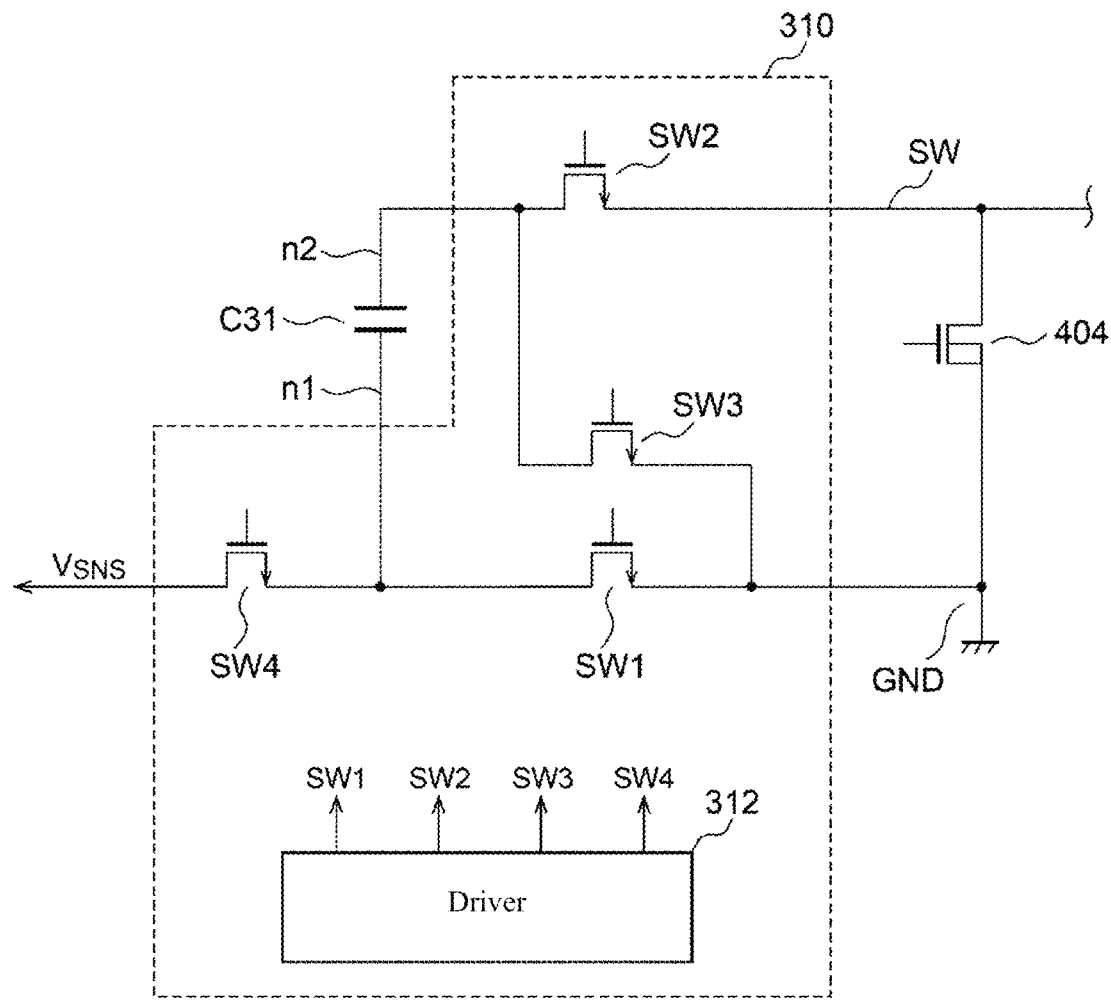
FIG. 5 is a circuit diagram of a configuration example of the switching circuit in FIG. 1.

Next, a configuration example of the switching circuit 310 is to be described below. FIG. 5 shows a circuit diagram of a configuration example of the switching circuit 310 in FIG. 1. Multiple switches SW1 to SW4 and a driver circuit 312 are included. The first switch SW1 is disposed between the first end n1 of the capacitor C31 and the ground line GND. The second switch SW2 is disposed between the second end n2 of the capacitor C31 and the switch line SW.

The third switch SW3 is disposed between the second end n2 of the capacitor C31 and the ground line GND. One end of the fourth switch SW4 is connected to the first end n1 of the capacitor C31, and the other becomes an output node of the switching circuit 310.

In the first phase φ1, the driver circuit 312 causes the first switch SW1 and the second switch SW2 to be turned on, and the third switch SW3 and the fourth switch SW4 to be turned off. Moreover, in the second phase φ2, the driver circuit 312 causes the first switch SW1 and the second switch SW2 to be turned off, and the third switch SW3 and the fourth switch SW4 to be turned on. A host controller (not shown) inputs a control signal (sensing signal) which indicates a current detection timing to the driver circuit 312, and switches between the first phase φ1 and the second phase φ2 according to the control signal.

Figure 6:
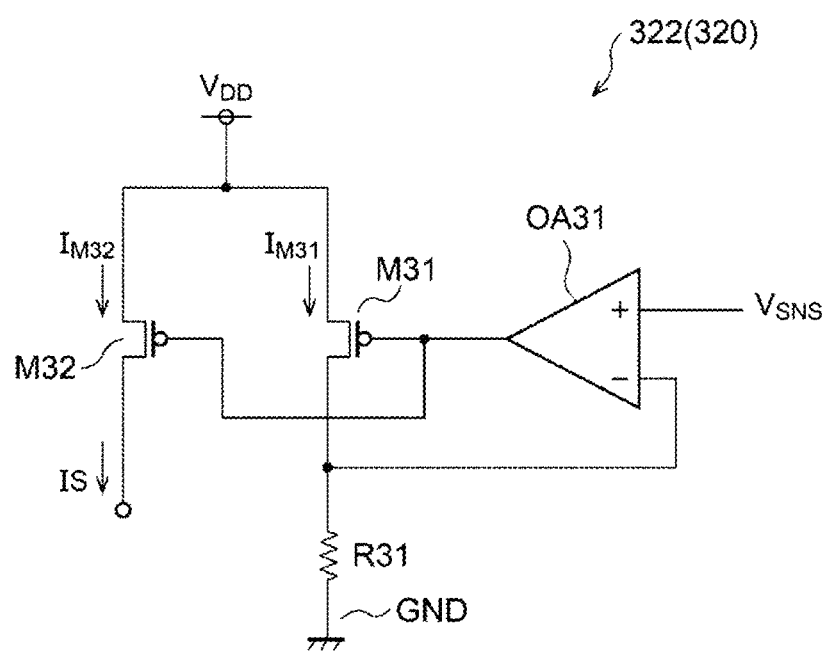
FIG. 6 is a circuit diagram of a configuration example of an output circuit.

FIG. 6 shows a circuit diagram of a configuration example of the output circuit 320. The output circuit 320 in FIG. 6 is a voltage/current conversion circuit 322, which converts the detection voltage $V_{SNS}$ from the front end into the current detection signal IS in form of a current signal.

The voltage/current conversion circuit 322 includes a first transistor M31 and a second transistor M32 implemented by P-channel metal oxide semiconductor (PMOS) transistors, a resistor R31 and an operational amplifier OA31. The first transistor M31 has a first terminal (source) connected to the power supply line $V_{DD}$. The second transistor M32 has a first terminal connected to the power supply line $V_{DD}$, and includes a control terminal (gate) connected to a control terminal (gate) of the first transistor M31.

The resistor R31 is disposed between a second terminal (source) of the first transistor M31 and the ground line GND. The operational amplifier OA31 receives the detection voltage $V_{SNS}$ from the switching circuit 310 at the front end and the voltage of a second terminal (drain) of the first transistor M31, and has an output node connected to a control terminal (gate) of the first transistor M31. A current flowing in the second transistor M32 becomes the current detection signal IS.

Since virtual short circuitry is established in the operational amplifier OA31, the voltage at a connecting node of the resistor R31 and the first transistor M31 is equal to the detection voltage $V_{SNS}$. Thus, a current that is $V_{SNS}/R31$ flows in the resistor R31, and the current also flows in the first transistor M31. A current $I_{M31}$ flowing in the first transistor M31 is duplicated by the second transistor M32, or is amplified and then output. A current $I_{M32}$ flowing in the second transistor M32 is proportional to the detection voltage $V_{SNS}$.

Next, the use of the current detection circuit 300 is described.

Figure 7:
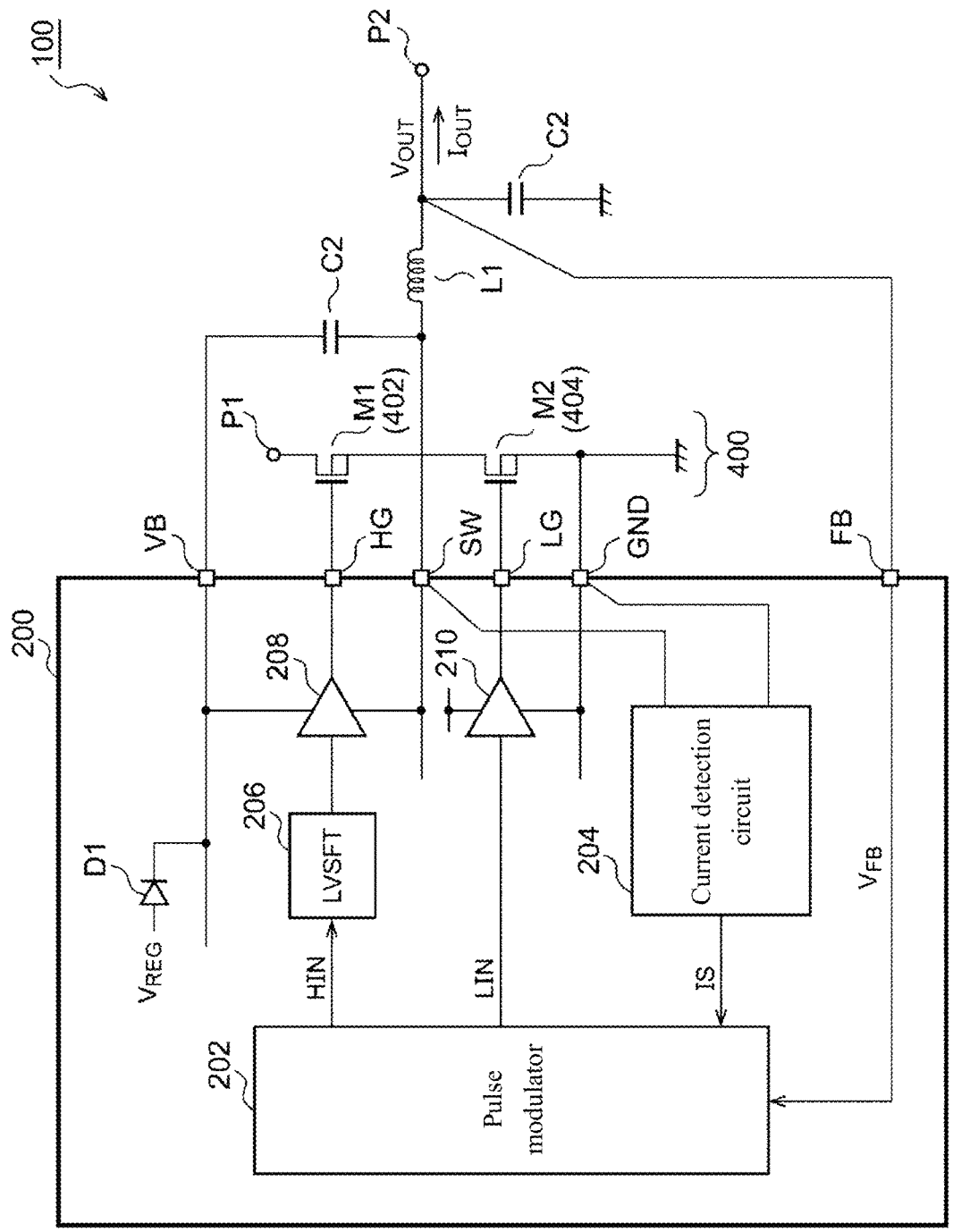
FIG. 7 is a circuit diagram of a DC/DC converter.

FIG. 7 shows a circuit diagram of a DC/DC converter 100. The DC/DC converter 100 is a synchronous rectification type DC/DC buck converter, which steps down the input voltage $V_{IN}$ of an input terminal P1 and supplies power to a load connected to an output terminal P2.

The DC/DC converter 100 includes a switching transistor M1, a synchronous rectification transistor M2, an inductor L1, an output capacitor C1, a bootstrap capacitor C2 and a control circuit 200. The control circuit 200 is a function integrated circuit (IC) integrated in a semiconductor substrate.

A high-side gate pin HG of the control circuit 200 is connected to the gate of the switching transistor M1, and a low-side gate pin LG is connected to the gate of the synchronous rectification transistor M2. The switching pin SW is connected to a switch line to which the switching transistor M1 and the synchronous rectification transistor M2 are connected. A ground pin GND is grounded. A bootstrap pin VB is connected to the bootstrap capacitor C2. A feedback signal corresponding to an output of the DC/DC converter 100 is input to a feedback pin FB. When an output of the DC/DC converter 100 is a constant voltage, the feedback signal is a signal corresponding to an output voltage $V_{OUT}$ of the DC/DC converter 100. When an output of the DC/DC converter 100 is a constant current, the feedback signal is a signal corresponding to an output current $I_{OUT}$ of the DC/DC converter 100.

The control circuit 200 includes a pulse modulator 202, a current detection circuit 204, a level shifter 206, a high-side driver 208, a low-side driver 210 and a diode D1. The diode D1 and the bootstrap C2 installed externally together form a bootstrap circuit, and the diode D1 has a cathode connected to the pin VB and an anode applied with a constant voltage VREG. The switching transistor M1 may also be a P-channel/PNP transistor, and in this case, the bootstrap circuit can be omitted.

Moreover, the switching transistor M1 and the synchronous rectification transistor M2 may also be integrated in the control circuit 200.

The pulse modulator 202 generates a pulse-modulated pulse signal such that a feedback signal $V_{FB}$ of the feedback pin FB approximates a target level. The control means or configuration of the pulse modulator 202 is not specifically defined, and any commonly known technique may be used. For example, the pulse modulator 202 is a pulse width modulator, and may feedback control a duty cycle of the pulse signal such that the feedback signal $V_{FB}$ approximates its target signal $V_{REF}$. Alternatively, the pulse modulator 202 may also be a pulse frequency modulator.

Moreover, the pulse modulator 202 may include a controller in a voltage mode, or may include a controller in a peak current mode or an average current mode. Alternatively, the pulse modulator 202 may also be in a peak current mode.

Moreover, the pulse modulator 202 may also include a controller with ripple control, and more specifically, including a controller with a hysteresis control (Bang-Bang control) method, a valley detection on-time fixed method, and a peak detection off-time fixed method.

The pulse modulator 202 generates a high-side control signal HIN and a low-side control signal LIN based on a pulse signal generated internally.

The level shifter 206 shifts the level of the high-side control signal HIN. The high-side driver 208 drives the switching transistor M1 according to a level shifted high-side control signal HIN'. The low-side driver 210 drives the synchronous rectification transistor M2 according to the low-level control signal LIN.

The current detection circuit 204 detects a current flowing in the synchronous rectification transistor M2, and generates a current detection signal IS. When the pulse modulator 202 includes a controller of a current mode, the current detection signal IS reflects the duty cycle or frequency of a pulse signal. Alternatively, the current detection signal IS may also be used to detect a light load status or overcurrent detection.

The current detection circuit 204 is formed by the structure of the current detection circuit 300. The switching transistor M1 and the synchronous rectification transistor M2 can correspond to the high-side transistor 402 and the low-side transistor 404 in FIG. 1. The pulse modulator 202 is synchronous with the switching of the switching transistor M1 and the synchronous rectification transistor M2, and generates a current sensing instruction SNS at an appropriate timing while the synchronous rectification transistor M2 is on. The current detection circuit 204 switches between the first phase ϕ1 and the second phase ϕ2, and generates the current detection signal IS in response to the current sensing instruction SNS.

Figure 8:
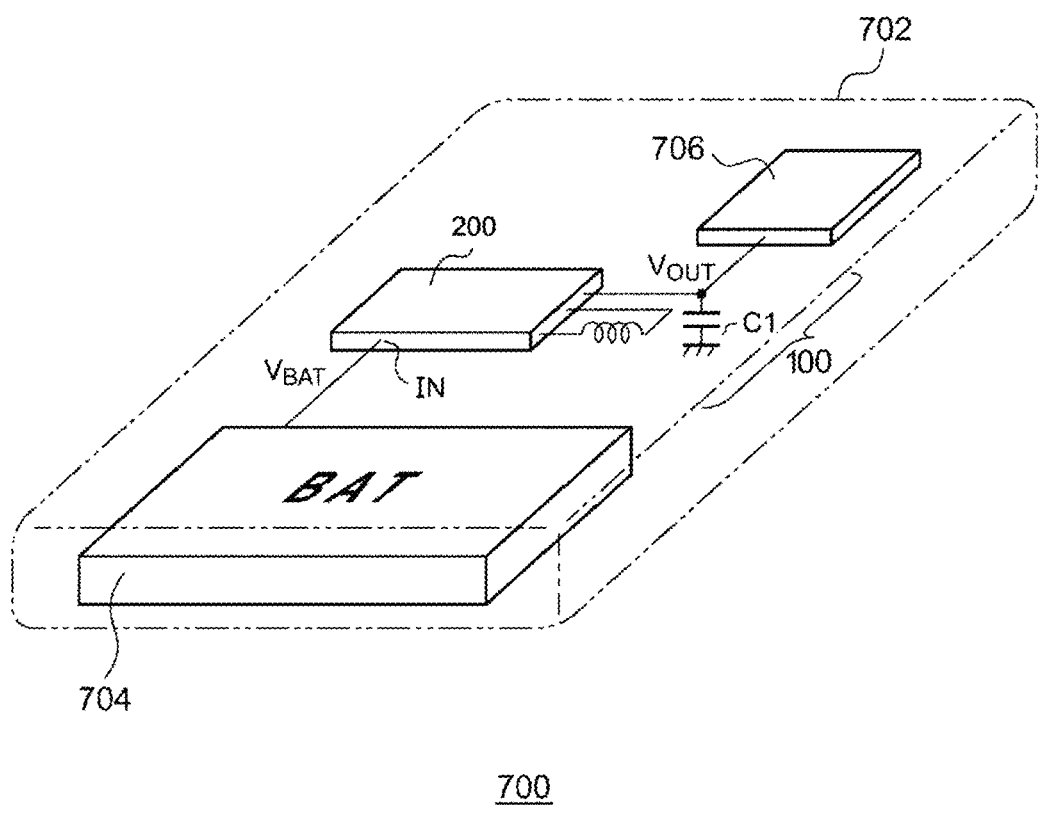
FIG. 8 is a diagram of an example of an electronic device having a DC/DC converter.

FIG. 8 shows a diagram of an example of an electronic device 700 having the DC/DC converter 100. The electronic device 700 is, for example, a battery driven device such as a cellphone terminal, a digital camera, a digital video recorder, a tablet terminal, and a portable audio player. The electronic device 700 includes a housing 702, a battery 704, a microprocessor 706 and the DC/DC converter 100. The DC/DC converter 100 has an input terminal receiving a battery voltage $V_{BAT}$ ($=V_{IN}$) from the battery 704, and supplies an output voltage $V_{OUT}$ to the microprocessor 706 connected to the output terminal.

Alternatively, the DC/DC converter 100 can be used for a power supply device mounted in a vehicle, or may be used for a battery charger.

It should be understood that, the embodiments are exemplary, and various modifications may be made to combinations of the constituting elements and processes, and such modifications are to be encompassed within the scope of the disclosure. Details of such variation examples are given in the description below.

The use of the current detection circuit 300 is not limited to a DC/DC converter, and can be extensively applied for current detection of a push-pull switching circuit that includes a high-side transistor and a low-side transistor.

Figure 9:
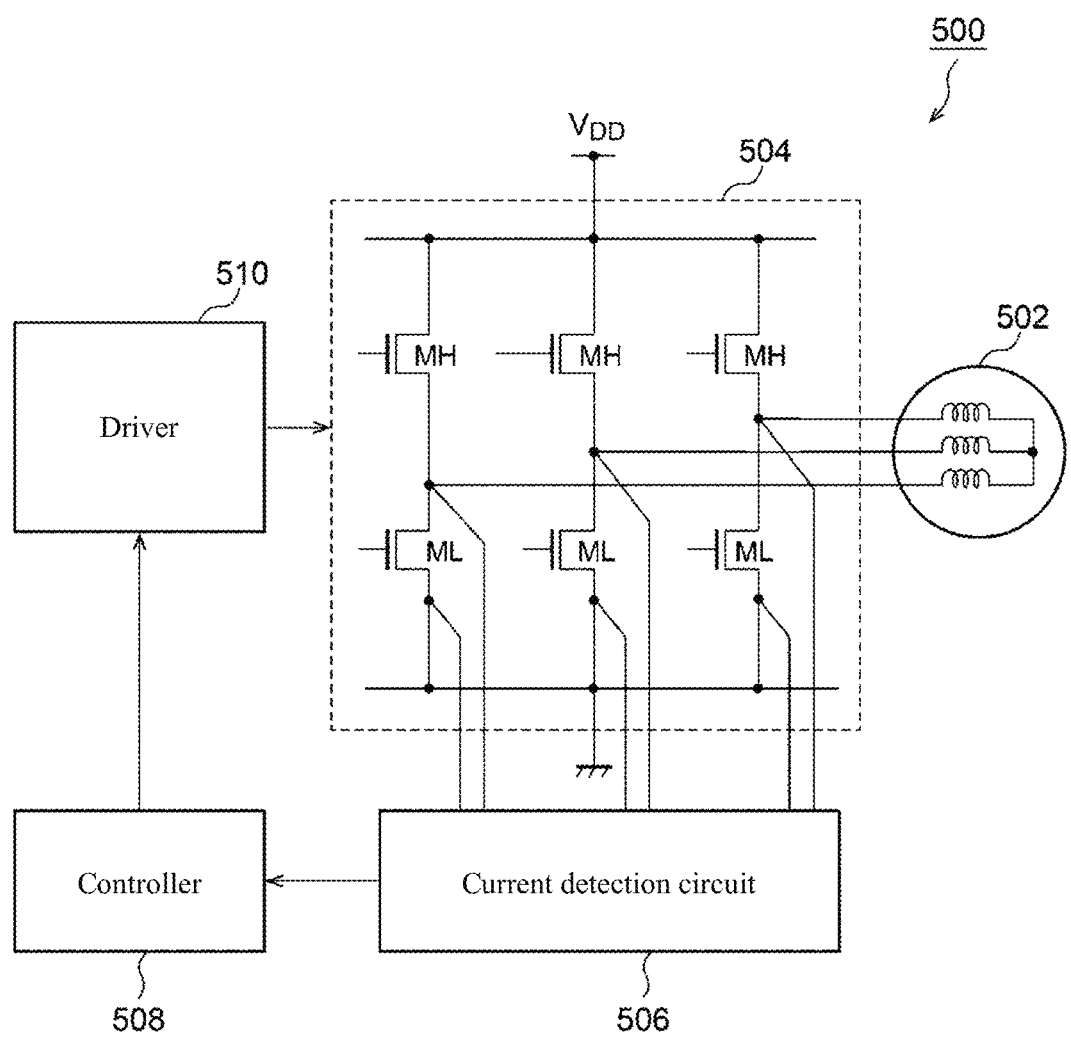
FIG. 9 is a circuit diagram of a motor driving system.

For example, the current detection circuit 300 can be used for current detection of a low-side transistor of a three-phase inverter or an H-bridge circuit using a motor as a load. FIG. 9 shows a circuit diagram of a motor driving system 500.

The motor 502 is a three-phase DC motor, and includes three-phase coils. The inverter 504 is a three-phase inverter connected to the motor 502, and includes three legs, each of which includes a high-side transistor MH and a low-side transistor ML.

The current detection circuit 506 detects currents of the phases. The controller 508 generates a control signal Sctrl based on a current detected by a current detection circuit. The driver 510 drives the inverter 504 based on the control signal Sctrl.

The current detection circuit 300 can be used for current detection of the low-side transistor ML in the current detection circuit 506.

The disclosed embodiments are for conveying principles and applications of the disclosure, and variations and modifications to the configurations may be made to these embodiments without departing from the conceptive scope of the disclosure defined in the appended claims.

The invention claimed is:

1. A control circuit for a synchronous rectifier including a high-side transistor and a low-side transistor, the control circuit comprising:
   a current detection circuit, generating a current detection signal which indicates a current flowing through the low-side transistor while the low-side transistor is on; and
   a pulse modulator that generates a pulse signal for controlling the high-side transistor and the low-side transistor based on the current detection signal, wherein the current detection circuit includes:
   a capacitor;
   a switch circuit,
   (ii) in a first phase, connecting a first end of the capacitor to a ground line, and connecting a second end of the capacitor to a switch line to which the high-side transistor and the low-side transistor are connected, and
   (ii) in a second phase, setting the first end of the capacitor to a high impedance, and connecting the second end of the capacitor to the ground line; and
   An output circuit, having a high impedance input and outputting a current detection signal based on a voltage generated at the first end of the capacitor in the second phase.

2. The control circuit of claim 1, wherein the switch circuit includes:
   a first switch, disposed between the first end of the capacitor and the ground line, and being turned on in the first phase;
   a second switch, disposed between the second end of the capacitor and the switching line, and being turned on in the first phase;
   a third switch, disposed between the second end of the capacitor and the ground line, and being turned on in the second phase; and
   a fourth switch, having an end connected to the first end of the capacitor, and being turned on in the second phase.

3. The control circuit of claim 2, wherein the output circuit further includes a voltage/current conversion circuit that converts the voltage generated at the first end of the capacitor into a current signal in the second phase.

4. The control circuit of claim 3, wherein the voltage/current conversion circuit includes:
   a first transistor, having a first terminal connected to a power supply line;
   a second transistor, having a first terminal connected to the power supply line, and including a control terminal connected to a control terminal of the first transistor;
   a resistor, disposed between a second terminal of the first transistor and the ground line; and
   an operational amplifier, receiving the voltage generated at the first end of the capacitor and a voltage at the second end of the first transistor, and having an output node connected to the control terminal of the first transistor, wherein
   the voltage/current conversion circuit outputs a current flowing in the second transistor.

5. The control circuit of claim 2, wherein the control circuit is integrated on a semiconductor substrate.

6. A synchronous rectification type DC/DC buck converter comprising the control circuit of claim 2.

7. The control circuit of claim 1, wherein the output circuit further includes a voltage/current conversion circuit that converts the voltage generated at the first end of the capacitor into a current signal in the second phase.

8. The control circuit of claim 7, wherein the voltage/current conversion circuit includes:
   a first transistor, having a first terminal connected to a power supply line;
   a second transistor, having a first terminal connected to the power supply line, and including a control terminal connected to a control terminal of the first transistor;
   a resistor, disposed between a second terminal of the first transistor and the ground line; and
   an operational amplifier, receiving the voltage generated at the first end of the capacitor and a voltage at the second end of the first transistor, and having an output node connected to the control terminal of the first transistor, wherein
   the voltage/current conversion circuit outputs a current flowing in the second transistor.

9. The control circuit of claim 1, wherein the control circuit is integrated on a semiconductor substrate.

10. A synchronous rectification type DC/DC buck converter comprising the control circuit of claim 1.

11. A current detection circuit, used with a push-pull switching circuit that includes a high-side transistor and a low-side transistor, and detecting a source current flowing through the low-side transistor, the current detection circuit comprising:
   a capacitor;
   a switch circuit,
   (i) in a first phase, connecting a first end of the capacitor to a ground line, and connecting a second end of the capacitor to a switch line to which the high-side transistor and the low-side transistor are connected, and
   (ii) in a second phase, setting the first end of the capacitor to a high impedance, and connecting the second end of the capacitor to the ground line; and
   an output circuit, having a high impedance input and outputting a current detection signal based on a voltage generated at the first end of the capacitor in the second phase.

12. The current detection circuit of claim 11, wherein the switch circuit includes:
   a first switch, disposed between the first end of the capacitor and the ground line, and being turned on in the first phase;
   a second switch, disposed between the second end of the capacitor and the switching line, and being turned on in the first phase;
   a third switch, disposed between the second end of the capacitor and the ground line, and being turned on in the second phase; and a fourth switch, having an end connected to the first end of the capacitor, and being turned on in the second phase.

13. The current detection circuit of claim 12, wherein the output circuit further includes a voltage/current conversion circuit that converts the voltage generated at the first end of the capacitor into a current signal in the second phase.

14. The current detection circuit of claim 13, wherein the voltage/current conversion circuit includes:
   a first transistor, having a first terminal connected to a power supply line;
   a second transistor, having a first terminal connected to the power supply line, and including a control terminal connected to a control terminal of the first transistor;
   a resistor, disposed between a second terminal of the first transistor and the ground line; and
   an operational amplifier, receiving the voltage generated at the first end of the capacitor and a voltage at the second end of the first transistor, and having an output node connected to the control terminal of the first transistor, wherein
   the voltage/current conversion circuit outputs a current flowing in the second transistor.

15. The current detection circuit of claim 12, wherein the current detection circuit is integrated on a semiconductor substrate.

16. The current detection circuit of claim 11, wherein the output circuit further includes a voltage/current conversion circuit that converts the voltage generated at the first end of the capacitor into a current signal in the second phase.

17. The current detection circuit of claim 16, wherein the voltage/current conversion circuit includes:
   a first transistor, having a first terminal connected to a power supply line;
   a second transistor, having a first terminal connected to the power supply line, and including a control terminal connected to a control terminal of the first transistor;
   a resistor, disposed between a second terminal of the first transistor and the ground line; and
   an operational amplifier, receiving the voltage generated at the first end of the capacitor and a voltage at the second end of the first transistor, and having an output node connected to the control terminal of the first transistor, wherein
   the voltage/current conversion circuit outputs a current flowing in the second transistor.

18. The current detection circuit of claim 17, wherein the current detection circuit is integrated on a semiconductor substrate.

19. The current detection circuit of claim 16, wherein the current detection circuit is integrated on a semiconductor substrate.

20. The current detection circuit of claim 11, wherein the current detection circuit is integrated on a semiconductor substrate.

* * * * *